(12) United States Patent
Kim et al.

(10) Patent No.: US 9,159,441 B2
(45) Date of Patent: Oct. 13, 2015

(54) METHOD OF OPERATING MEMORY DEVICE ASSURING RELIABILITY AND MEMORY SYSTEM

(71) Applicant: SAMSUNG ELECTRONICS CO., LTD., Suwon-Si, Gyeonggi-Do (KR)

(72) Inventors: Jun Hee Kim, Seoul (KR); Hyun Sik Yun, Hwaseong-Si (KR); Youn Won Park, Suwon-Si (KR); Hee Tai Oh, Goyang-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/446,349

(22) Filed: Jul. 30, 2014

(65) Prior Publication Data
US 2015/0103599 A1    Apr. 16, 2015

(30) Foreign Application Priority Data
Oct. 11, 2013  (KR) .......................... 10-2013-0121578

(51) Int. Cl.
*G11C 16/04*    (2006.01)
*G11C 16/26*    (2006.01)

(52) U.S. Cl.
CPC ..................................... *G11C 16/26* (2013.01)

(58) Field of Classification Search
USPC .............. 365/185.05, 185.08, 185.09, 185.17
See application file for complete search history.

(56) References Cited

U.S. PATENT DOCUMENTS

| | | | |
|---|---|---|---|
| 7,602,642 B2 | 10/2009 | Choi | |
| 7,971,014 B2 | 6/2011 | Yoshii et al. | |
| 8,179,706 B2 | 5/2012 | Abraham | |
| 8,190,812 B2 | 5/2012 | Yano et al. | |
| 8,199,583 B2 | 6/2012 | Kim et al. | |
| 8,369,147 B2 | 2/2013 | Aritome | |
| 2009/0287975 A1 | 11/2009 | Kim et al. | |
| 2011/0055625 A1 | 3/2011 | Honda | |
| 2011/0216587 A1 | 9/2011 | Lee | |
| 2011/0283166 A1* | 11/2011 | Kim et al. ..................... | 714/773 |
| 2012/0063231 A1* | 3/2012 | Wood et al. .............. | 365/185.18 |

OTHER PUBLICATIONS

US 8,036,037, 10/2011, Kim et al. (withdrawn)

* cited by examiner

*Primary Examiner* — Vu Le
(74) *Attorney, Agent, or Firm* — Volentine & Whitt, PLLC

(57) ABSTRACT

A method of operating a memory device to guarantee program reliability and a memory system using the same are provided. The method includes backing up data stored in the memory cells connected to a first word line, performing a dummy program operation on memory cells connected to a second word line adjacent to the first word line, and performing a recharge program operation on the memory cells connected to the first word line.

16 Claims, 19 Drawing Sheets

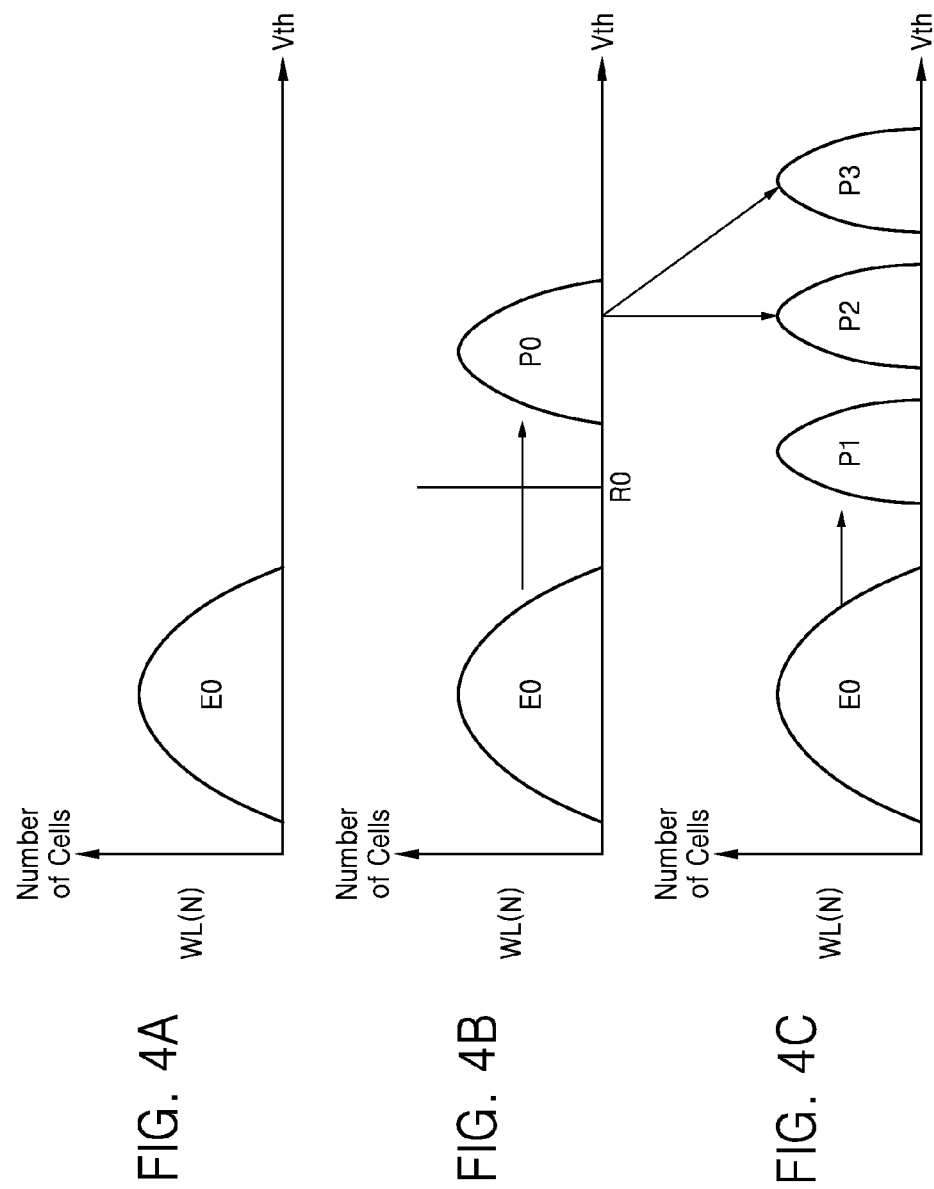

METHOD OF OPERATING MEMORY DEVICE ASSURING RELIABILITY AND MEMORY SYSTEM

CROSS-REFERENCE TO RELATED APPLICATIONS

This application claims priority under 35 U.S.C. §119(a) from Korean Patent Application No. 10-2013-0121578 filed on Oct. 11, 2013, the subject matter of which is hereby incorporated by reference.

BACKGROUND

Embodiments of the inventive concept relate to methods of operating memory devices and related memory systems that provide improved program reliability.

Memory devices are supposed to provide reliability in the storage and retrieval of data. To ensure the reliability of stored data, certain procedures for determining whether or not data has properly been correctly written (or programmed) to a memory device have previously been used. These procedures are performed after the data has been written to the constituent memory cells of the memory device. Additionally, when the data is read from the memory device, certain error detection and/or correction procedures are performed to detect and/or correct one or more errors in the retrieved data.

SUMMARY

According to some embodiments of the inventive concept, there is provided a method of operating a memory device. The method includes reading a first page of memory cells connected to a selected word line, and determining whether the first page is a clean page; upon determining that the first page is the clean page, backing up data stored in the memory cells connected to a first word line; performing a dummy program operation on memory cells connected to a second word line adjacent to the first word line; and performing a recharge program operation on the memory cells connected to the first word line.

When the first page is a least significant bit (LSB) page, and the first word line may be the selected word line.

The backing up the data may includes reading first LSB data from the memory cells connected to the first word line and storing the first LSB data in a backup region.

The performing the recharge program operation includes reading first LSB data from the memory cells connected to the first word line, and storing the first LSB data, storing first most significant bit (MSB) data, and performing a program operation using the stored first LSB data and the stored first MSB data.

Upon determining that the first page is an MSB page, the method may further include backing up LSB data stored in memory cells connected to a third word line adjacent to the first word line and performing a recharge program operation on the memory cells connected to the third word line. At this time, the third word line may be the selected word line.

According to other embodiments of the inventive concept, there is provided a method of operating a memory device. The method includes reading a first page of memory cells connected to a first word line, and determining whether the first page is a clean page; upon determining that the first page is the clean page, backing up LSB data stored in the memory cells connected to the first word line; performing a recharge program operation on the memory cells connected to the first word line; backing up LSB data stored in memory cells connected to a second word line adjacent to the first word line; performing a dummy program operation on memory cells connected to a third word line adjacent to the second word line; and performing a recharge program operation on the memory cells connected to the second word line.

The backing up the data may include reading first LSB data from the memory cells connected to the word line and storing the first LSB data in a backup region.

The performing the dummy program operation may include programming second LSB data to the memory cells connected to the third word line and the second LSB data is randomly generated.

The performing the recharge program operation may include reading first LSB data from the memory cells connected to the first word line, and storing the first LSB data, storing first MSB data, and performing a program operation using the stored first LSB data and the stored first MSB data.

According to further embodiments of the inventive concept, there is provided a memory system including a nonvolatile memory device and a memory controller configured to control operation of the nonvolatile memory device. The memory controller includes a target determination unit configured to generate page information regarding at least one of a target of a dummy program operation and a target of a recharge program operation, a backup unit configured to perform a backup operation based on the page information, and a dummy/recharge program unit configured to perform the dummy program operation and the recharge program operation based on the page information.

The target determination unit may include an error correction code unit configured to perform error correction based on first original read data that has been read from the nonvolatile memory device and to generate modified read data, a correction determination unit configured to determine whether an error has been corrected based on the modified read data and to generate a correction result signal according to a determination result, and a clean page determination unit configured to determine whether the modified read data corresponds to a clean page based on the correction result signal and to generate clean page information. The first original read data may be data stored in a first word line of the nonvolatile memory device.

When the clean page is an LSB page according to the clean page information, the backup unit may back up LSB page data of a second word line adjacent to the first word line.

The dummy/recharge program unit may perform the dummy program operation on the first word line and perform the recharge program operation on a second word line adjacent to the first word line when the clean page is an LSB page according to the clean page information. The dummy/recharge program unit may perform the recharge program operation on the first and second word lines and perform the dummy program operation on a third word line adjacent to the second word line when the clean page is an MSB page according to the clean page information.

BRIEF DESCRIPTION OF THE DRAWINGS

The above and other features and advantages of the inventive concept will become more apparent by describing in detail exemplary embodiments thereof with reference to the attached drawings in which:

FIGS. 4A, 4B and 4C are related conceptual diagrams illustrating changes in the threshold voltage of memory cells during execution of normal program operation;

DETAILED DESCRIPTION OF THE EMBODIMENTS

Figure 1A:
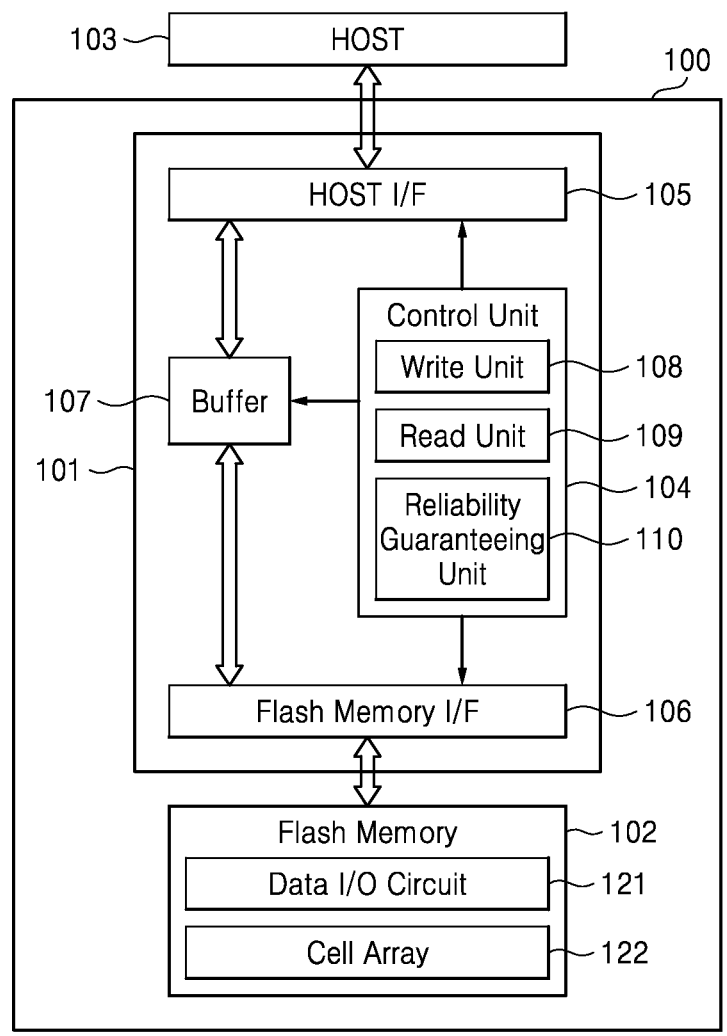
FIG. 1A is a block diagram illustrating a memory system according to embodiments of the inventive concept.

Embodiments of the inventive concept will now be described in some additional detail with reference to the accompanying drawings. The inventive concept may, however, be embodied in many different forms and should not be construed as being limited to only the illustrated embodiments. Rather, these embodiments are provided so that this disclosure will be thorough and complete, and will fully convey the scope of the invention to those skilled in the art. Throughout the written description and drawings, like reference numbers and labels are used to denote like or similar elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Once a program operation has been properly executed in relation to selected memory cells of a nonvolatile memory device (e.g., a flash memory device) designated by one or more address(es), the memory cells should exhibit a threshold voltage that falls within a defined threshold voltage distribution associated with an intended program state. Hence, the program state of the memory cells may subsequently be interpreted as a given data value associated with the program state and a corresponding threshold voltage distribution. When the memory cells have been normally programmed, the resulting threshold voltage distribution for programmed memory cells will usually fall within a Gaussian distribution. However, when an transient event, such as sudden power-off, disrupts the execution of a normal program operation, the selected memory cells will not be properly programmed to the desired program state. The resulting threshold voltage distribution for the selected memory cells will be abnormally. As a result, when the state of the memory cells is subsequently read, a read error will occur. That is, the improperly (due to the sudden power-off) programmed memory cells will exhibit threshold voltages that indicate program state(s) different from the intended program state.

Moreover, since the threshold voltage distribution for the memory cells will deteriorate over the time, the number of memory cells producing read errors will also increase over time. Therefore, complementary operations, such as an operation that determines (or checks) whether or not the programmed memory cells have been normally programmed must be performed. Further, when it is determined that the memory cells have not been normally programed, an operation of reprogramming the constituent data in the memory cells is usually required to ensure the reliably of stored data.

FIG. 1A is a block diagram of a memory system 100 according to embodiments of the inventive concept. The memory system 100 generally includes a memory controller 101 and a nonvolatile memory device 102. The nonvolatile memory device 102 may be a flash memory device, but the inventive concept is not restricted to only flash memory devices but may include a resistive memory device such as a resistive random access memory (RRAM) device, a phase-change RAM (PRAM) device, and/or a magnetic RAM (MRAM) device. The memory system 100 is connected to a host 103 via one or more wireless or hard-wired connection paths.

The memory controller 101 may be used to perform certain control operations with respect to the nonvolatile memory device 102. That is, the memory controller 101 may send an address (ADDR in FIG. 2), a command (CMD in FIG. 2), and/or one or more control signal(s) (CTRL in FIG. 2) to control the program (or write), read and/or erase operations performed by the nonvolatile memory device 102. The memory controller 101 shown in FIG. 1A includes a control unit 104, a host interface (I/F) 105, a flash memory I/F 106, and a buffer 107.

The host I/F 105 may be used to communicate data and related control signals generated by the memory controller 101 to the host 103, and also to communicate various control, address and/or data (hereafter, singularly, collectively or in any combination "CAD") signals provided by the host 103 to the control unit 104 and/or buffer 107 of memory controller 101. The flash memory I/F 106 may be used to communicate CAD signals generated by the memory controller 101 to the nonvolatile memory device 102, and also to communicate CAD signals received from the nonvolatile memory device 102.

Thus, the buffer 107 may be used to the host I/F 105 and flash memory I/F 106 to temporarily store "write data" received from the host 103 and to-be-written to the flash memory 102 during a program operation, as well as "read data" retrieved from the nonvolatile memory device 102 during a read operation.

The control unit 104 may be used to control the interoperation of the buffer 107, host I/F 105, and flash memory I/F 106 of the memory controller 101. The control unit 104 illustrated in FIG. 1A includes, for example, a read unit 109, a write unit 108, and a reliability guaranteeing unit 110. The read unit 109 is used to retrieve read data from the nonvolatile memory device 102 and stores it in the buffer 107. The write unit 108 is used to program write data to the nonvolatile memory device 102, as well as erase data stored in the nonvolatile memory device 102.

When a program operation has been abnormally performed in relation to certain memory cells, the reliability guaranteeing unit 110 may be used to (1) read data from a last-programmed block (e.g., the block last programmed before a sudden power-off), (2) detect a last word line (or last page) that was last programmed before the sudden power-off, (3) determine a target word line (or target page) for a dummy and/or recharge program operation, and (4) perform the dummy and/or recharge program operation(s) in relation to the target word line (or target page). The reliability guaranteeing unit 110 may also be used to "back up" the data stored by the target word line before the recharge program is executed.

In the foregoing context, the term "guaranteeing" should not be strictly construed as meaning any and all data errors associated with an abnormally executed program operation are absolutely corrected by the foregoing set of method steps. Rather, the term guaranteeing should be understood as seeking to "ensure" a minimum of improperly programmed memory cells following a transient event, such as a sudden power-off.

The nonvolatile memory device 102 includes a data input/output (I/O) circuit 121 and a cell array 122. The data I/O circuit 121 may be used to control the read, program and erase operations of the nonvolatile memory device 102 in response to CAD signals received from the memory controller 101.

The cell array 122 may include a plurality of memory cells arranged at the respective intersections of a plurality of word lines and a plurality of bit lines. The memory cells may be flash memory cells and the cell array 122 may be a NAND flash memory cell array 122 or a NOR flash memory cell array 122. Hereinafter, it is assumed that the memory cells are flash memory cells in the embodiments, but the inventive concept is not restricted to these embodiments and the memory cells may be resistive memory cells such as RRAM cells, PRAM cells, or MRAM cells.

When a transient event, such as a sudden power-off or program voltage drop, occurs during a program operation directed to selected memory cells of a selected word line of the cell array 122, the program operation is deemed to be abnormally performed. Therefore, once the nonvolatile memory device 102 recovers from the transient event (e.g., restores nominal power levels), it is necessary to determine whether or not the memory cells last being accessed during execution of the abnormal (interrupted) program operation have been normally or abnormally programmed. That is, a determination must be made as to whether a program error has occurred, and exactly when in relation to the implicated memory cells, the program error occurred. This information is necessary in order to execute one or more complementary operation(s) capable of remediating errantly programmed memory cells. In the context of certain embodiments of the inventive concept, the memory controller 101 of FIG. 1A includes the reliability guaranteeing unit 110 that may be used to accomplish these objects.

In this regard, the memory controller 101 may send to the nonvolatile memory device 102 a "last address" that identifies one or more "last-programmed memory cells" that were being programmed by the abnormal program operation before the transient event. In response, the nonvolatile memory device 102 reads "last data" from the last-programmed memory cells and sends the last data to the memory controller 101. Then, the reliability guaranteeing unit 110 determines whether or not the last data is errant (i.e., includes one or more errors). When the reliability guaranteeing unit 110 determines that the last data is, in fact, errant the program operation interrupted by the transient event is deemed to be abnormal. Based upon this determination, the memory controller 101 may send a control signal and/or command to the flash memory device 102 so that backup, recharge program and/or dummy program operations may be performed on the last-programmed memory cells in order to ensure the reliability of the data stored by the last-programmed memory cells without necessarily reprogramming all of the memory cells in a "bad region" (e.g., a block) containing the last-programmed memory cells.

Figure 1B:
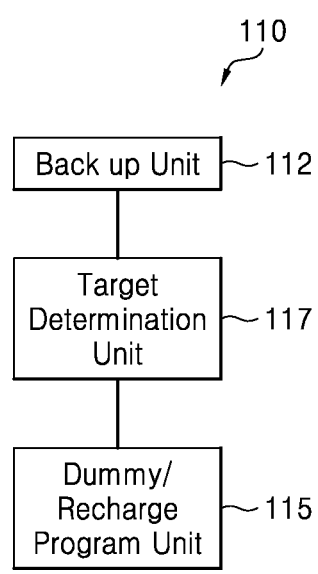
FIG. 1B is a block diagram further illustrating in one example the reliability guaranteeing unit 110 of FIG. 1A.

FIG. 1B is a block diagram further illustrating in one example the reliability guaranteeing unit 110 of FIG. 1A. Here, the reliability guaranteeing unit 110 includes a target determination unit 117, a backup unit 112, and a dummy/recharge program unit 115. The target determination unit 117 may be used to determine a target page or target word line to which the dummy and/or recharge program operations may be directed. For instance, the target determination unit 117 may read data from a "last programmed block" (e.g., a block last being programmed just before the transient event) in order to identify a word line last being programmed before the transient event occurred. In certain embodiments of the inventive concept using multi-level memory cells (MLC) configured to store two or more bits of data per memory cell, the target determination unit 117 may read data from the last programmed block in order to identify a particular page of a word line last being programmed before the transient event occurred. Upon identification, the relevant word line will be designated the "target word line", or alternately, upon identification, the relevant page will be designated the "target page" of the subsequently executed dummy and/or recharge program operation(s).

The dummy/recharge program unit 115 may be used to perform the dummy program operation and/or the recharge program operation in relation to a target word line (target page). Similarly, the backup unit 112 may be used to perform a backup operation in relation to the target word line (target page). For instance, the backup unit 112 may be used to back up (e.g.,) the least significant bit (LSB) data stored by memory cells of the target word line before a recharge program operation is directed to the memory cells of the target word line.

Figure 2:
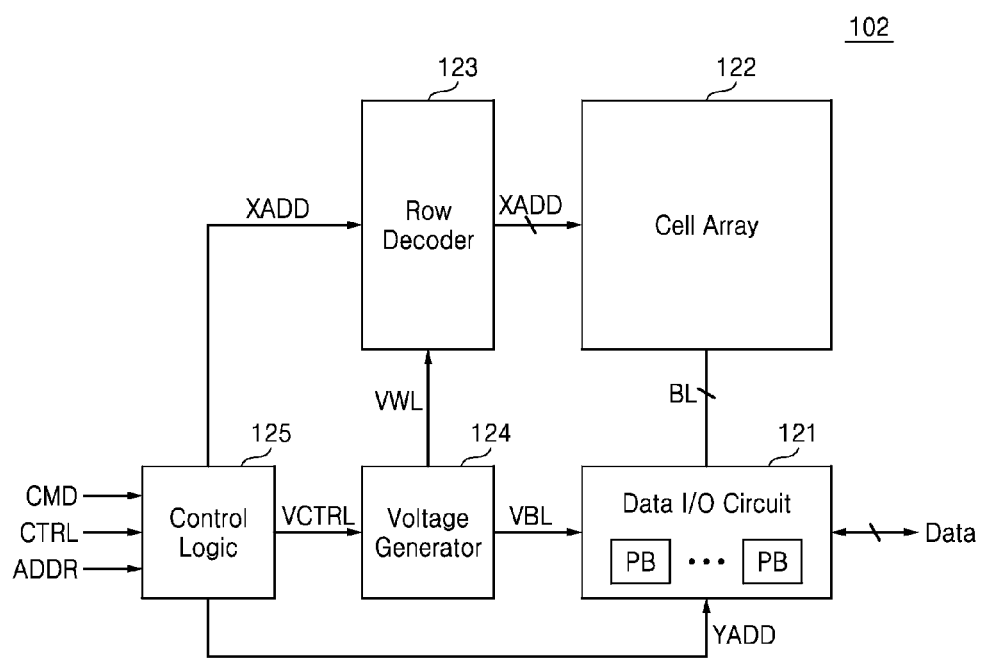
FIG. 2 is a block diagram further illustrating the nonvolatile memory device 102 of FIG. 1A.

FIG. 2 is a block diagram further illustrating in one example the nonvolatile memory device 102 of FIG. 1A. Here, the nonvolatile memory device 102 is assumed to be a flash memory device including the cell array 122, a row decoder 123, the data I/O circuit 121, a voltage generator 124, and a control logic 125.

The cell array 122 includes a plurality of memory cells each connected to one of a plurality of word lines and one of a plurality of bit lines BL. As will be described with reference to FIGS. 3A and 3B later, the memory cells may be NAND flash memory cells and arranged in a two-dimensional structure or a three-dimensional vertical structure. The memory cells may be MLC, and may be programmed using various program methods such as a shadow program method, reprogram method, or on-chip buffered program method.

The row decoder 123 may be used to select a word line based on a row address XADD, thereby selecting the memory cells connected to the selected word line. For instance, a program voltage and a verify voltage may be applied to a selected word line during a program operation (or write mode), a read voltage may be applied to the selected word line during a read operation (or read mode), and an erase voltage may be applied to the selected word line during an erase operation. Any one of these (and other) word line voltages (VWLs) may be applied to a selected word line as provided by the voltage generator 124 in response to a voltage control signal (VCTRL) provided by the control logic 125.

The data I/O circuit 121 is connected to the bit lines BL and stores write data to be programmed to the cell array 122 and read data sensed from the cell array 122. The data I/O circuit 121 may include a plurality of page buffers PB corresponding to the bit lines BL and a column decoder (not shown) that selects a bit line based on a column address YADD. Each of the page buffers PB may include a plurality of latches (not shown) and may function as a write driver or a sense amplifier according to an operation mode of the nonvolatile memory device 102. The data I/O circuit 121 may load write data received from an external device and apply a program permission voltage or a program inhibit voltage to the bit lines BL according to the write data during a program operation in write mode. The data I/O circuit 121 may also sense a voltage from the bit lines BL and output read data in read mode.

The control logic 125 generates control signals that control the overall operation of the nonvolatile memory device 102, including the voltage control signal VCTRL provided to the voltage generator 124. According to certain embodiments of the inventive concept, the control logic 125 may be disposed internal to, or external from the nonvolatile memory device 102.

The voltage generator 124 may be sued to generate various word line voltages and bit line voltages in response to the voltage control signal VCTRL. For example, a word line voltage applied to the row decoder 123 may be a program voltage, read voltage, or erase voltage according to operating mode. A bit line voltage applied to the data I/O circuit 121 may be a program permission voltage, a program inhibit voltage, or a precharge voltage, for example.

Figure 3A:
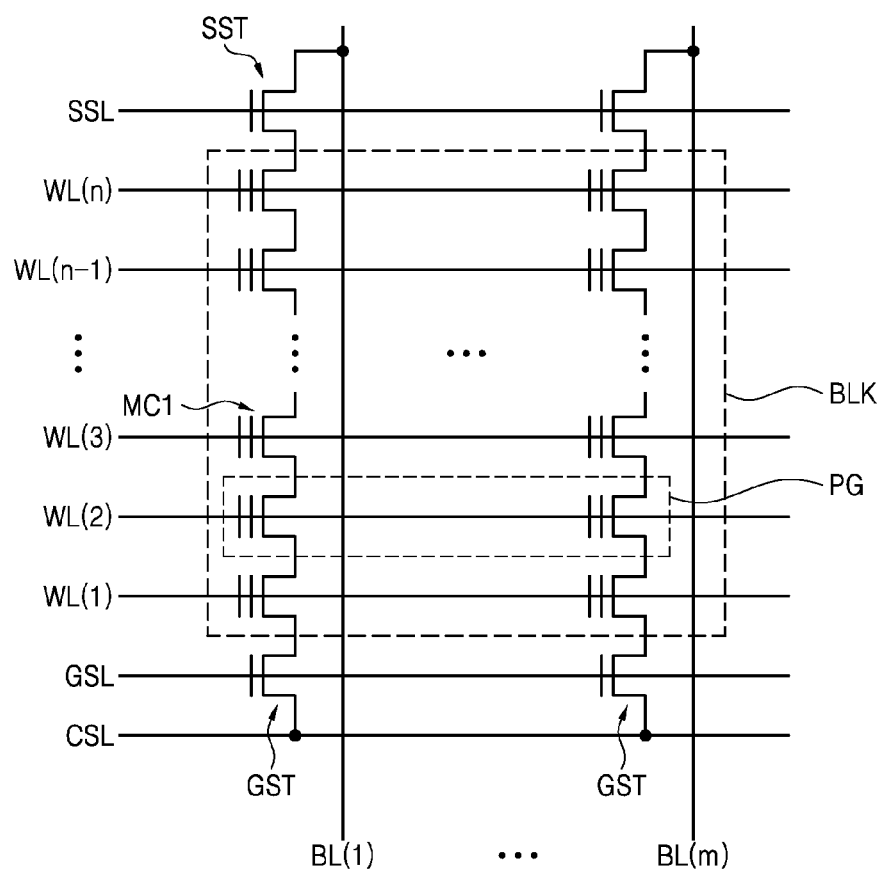
FIGS. 3A and 3B are respective wiring diagrams illustrating in various examples a memory cell array that may be included in the nonvolatile memory device of FIG. 2.
Figure 3B:
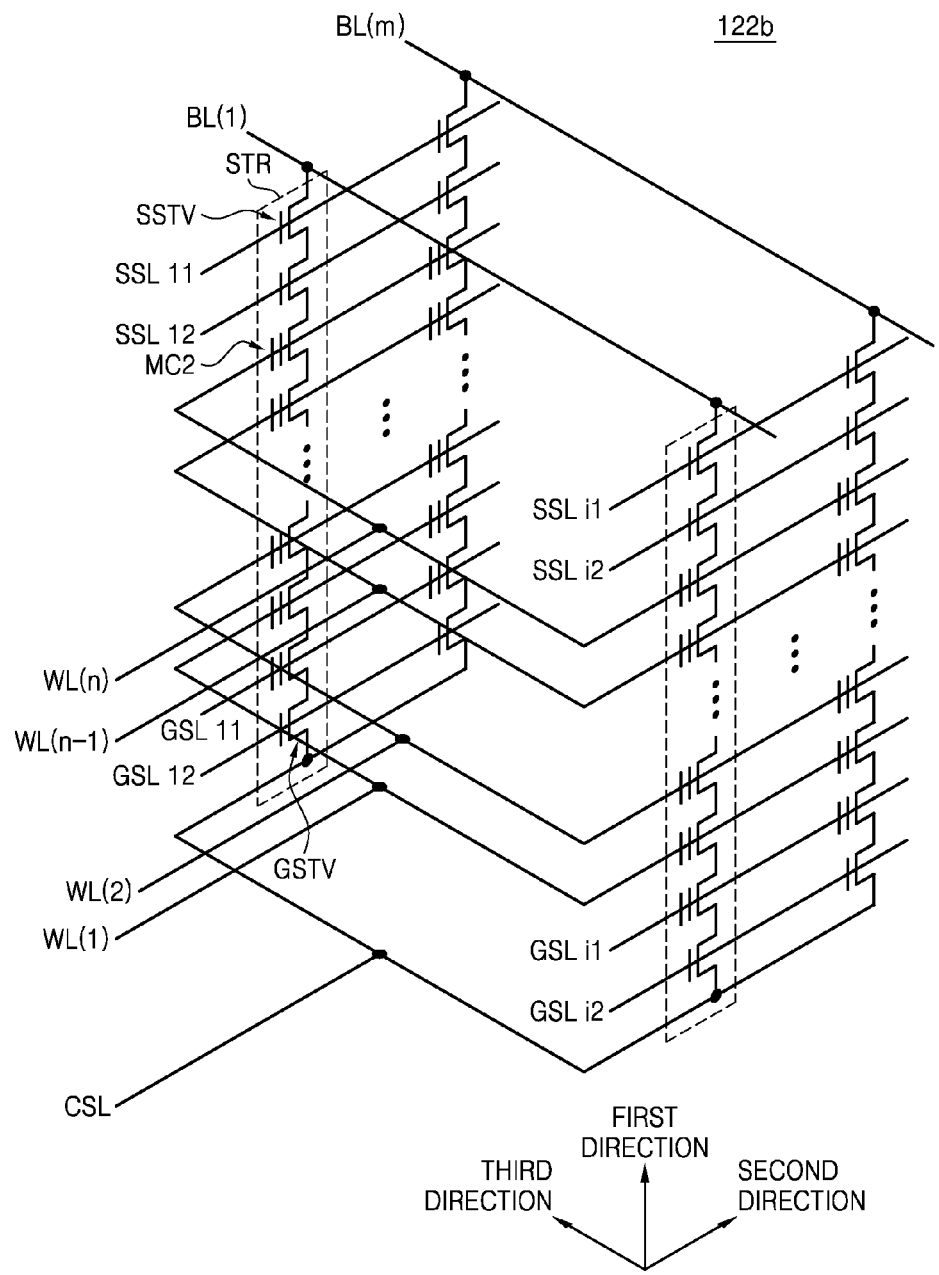

FIGS. 3A and 3B are respective wiring diagrams that illustrate examples 122a and 122b of the cell array 122 that may be included in the nonvolatile memory device 102 of FIG. 2. Referring to FIG. 3A, the cell array 122a may include a plurality of bit lines BL(1) through BL(m), a plurality of word lines WL(1) through WL(n), and a plurality of memory cells MC1 placed at the intersections between the bit lines BL(1) through BL(m) and the word lines WL(1) through WL(n). The cell array 122a may also include string select transistors SST and ground select transistors GST. The string select transistors SST may be respectively connected to the bit lines BL(1) through BL(m) and the ground select transistors GST may be connected to a common source line CSL. Memory cells MC1 in a column may be arranged in series between one of the bit lines BL(1) through BL(m) and the common source line CSL. Memory cells MC1 in a row may be connected in common to one of the word lines WL(1) through WL(n). In other words, the memory cells MC1 may be connected in series between the string select transistors SST and the ground select transistors GST. 16, 32 or 64 word lines may be arranged between a string select line SSL and a ground select line GSL.

The string select transistors SST may be connected to the string select line SSL so that string select transistors SST are controlled according to the level of a voltage input from the string select line SSL. The ground select transistors GST may be connected to the ground select line GSL so that the ground select transistors GST are controlled according to the level of a voltage input from the ground select line GSL. The memory cells MC1 may be controlled according to the level of a voltage applied to the word lines WL(1) through WL(n). Memory cells MC1 connected to each of the word lines WL(1) through WL(n) may store data corresponding to a page PG or a plurality of pages PG.

A NAND flash memory device may perform a write (or program) operation and a read operation in units of pages PG and may perform an erase operation in units of blocks BLK. Information regarding the program or erase operation on each page PG is stored in memory cells allocated for a spare region (or a portion of a main area). This information is referred to as flag information and memory cells storing the flag information are referred to as flag cells.

A program operation for a bit may be independently performed up to N times on an MLC that stores N-bit data. Each program operation may be comprised of a plurality of program loops. A program operation for each bit (e.g., LSB or most significant bit (MSB)) of an MLC may be performed on cells connected to one of the word lines WL(1) through WL(n) page by page. Page addresses may be continuously or discontinuously assigned in a word line direction for a program operation. An internally assigned page address may be internally determined considering the use frequency of a selected memory cell.

Referring to FIG. 3B, the cell array 122b may include a plurality of strings STR having a vertical structure. A plurality of strings STR may be arranged in a second direction to form a string column. A plurality of string columns may be arranged in a third direction to form a string array. Each of the strings STR may include ground select transistors GSTV, memory cells MC2, and string select transistors SSTV, which are arranged in series between one of the bit lines BL(1) through BL(m) and the common source line CSL along a first direction.

Ground select transistors GSTV may be respectively connected to ground select lines GSL11, GSL12, . . . , GSL11, and GSL12 and string select transistors SSTV may be respectively connected to string select lines SSL11, SSL12, . . . , SSL11, and SSL12. Memory cells MC2 arranged on one layer may be connected in common to one of the word lines WL(1) through WL(n). The ground select lines GSL11 through GSL12 and the string select lines SSL11 through SSL12 may be extended in the second direction and may be arranged in the third direction. The word lines WL(1) through WL(n) may be extended in the second direction and may be arranged in the first and third directions. The bit lines BL(1) through BL(m) may be extended in the third direction and may be arranged in the second direction. The memory cells MC2 may be controlled according to the level of a voltage applied to the word lines WL(1) through WL(n).

A vertical flash memory device including the cell array 122b includes NAND flash memory cells. Accordingly, like a usual NAND flash memory device, the vertical flash memory device may perform write and read operations in units of pages and may perform an erase operation in units of blocks.

In some embodiments, two string select transistors included in each string STR may be connected to one string selection line and two ground select transistor included in the string may be connected to one ground select line. In other embodiments, each string may include one string select transistor and one ground select transistor.

FIGS. 4A, 4b and 4C are related conceptual diagrams illustrating changes in the threshold voltage of nonvolatile memory cells when a normal program operation is performed. A 2-bit MLC is assumed in the example of FIGS. 4A, 4B and 4C. Thus, data associated with two (2) pages may be stored in the memory cells connected to single word line. Hereinafter, it is assumed that a first-programmed page programmed by the flash memory device 102 is a LSB page that is programmed during a LSB program operation, and a second-programmed (after the first-programmed) page programmed by the flash memory device 102 is a MSB page that is programmed during a MSB program operation. Hence, in the graphs of FIGS. 4A, 4B and 4C, the horizontal axis indicates threshold voltage and the vertical axis indicates a number of cells.

Referring to FIG. 4A, the threshold voltage distribution of cells connected to a selected word line WL(N) is in an erase state E0 before a program operation is performed. Thereafter, when the LSB program operation is performed on the cells connected to the selected word line WL(N), the threshold voltage distribution shifts from the erase state E0 to an LSB program state P0, as shown in FIG. 4B. Thereafter, when the MSB program operation is performed on the selected word line WL(N), the threshold voltage distribution shifts from the erase state E0 to a program state P1 and from the LSB program state P0 to program states P2 and P3, as shown in FIG. 4C. When the LSB page and the MSB page are completely programmed to the selected word line WL(N), the cells connected to the selected word line WL(N) have four threshold voltage distributions.

Figure 5:
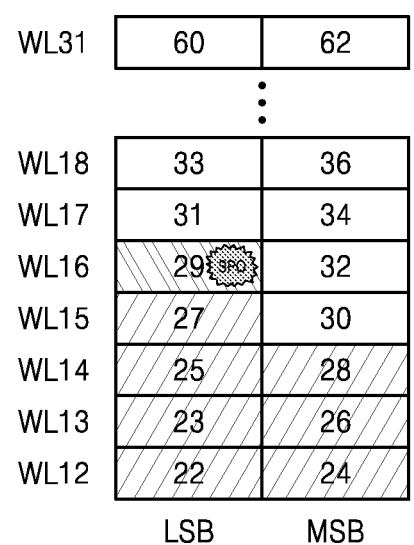
FIG. 5 is a conceptual diagram illustrating a multi-level cell (MLC) programming sequence in relation to a case where sudden power-off occurs during a least significant bit (LSB) program operation.
Figure 6:
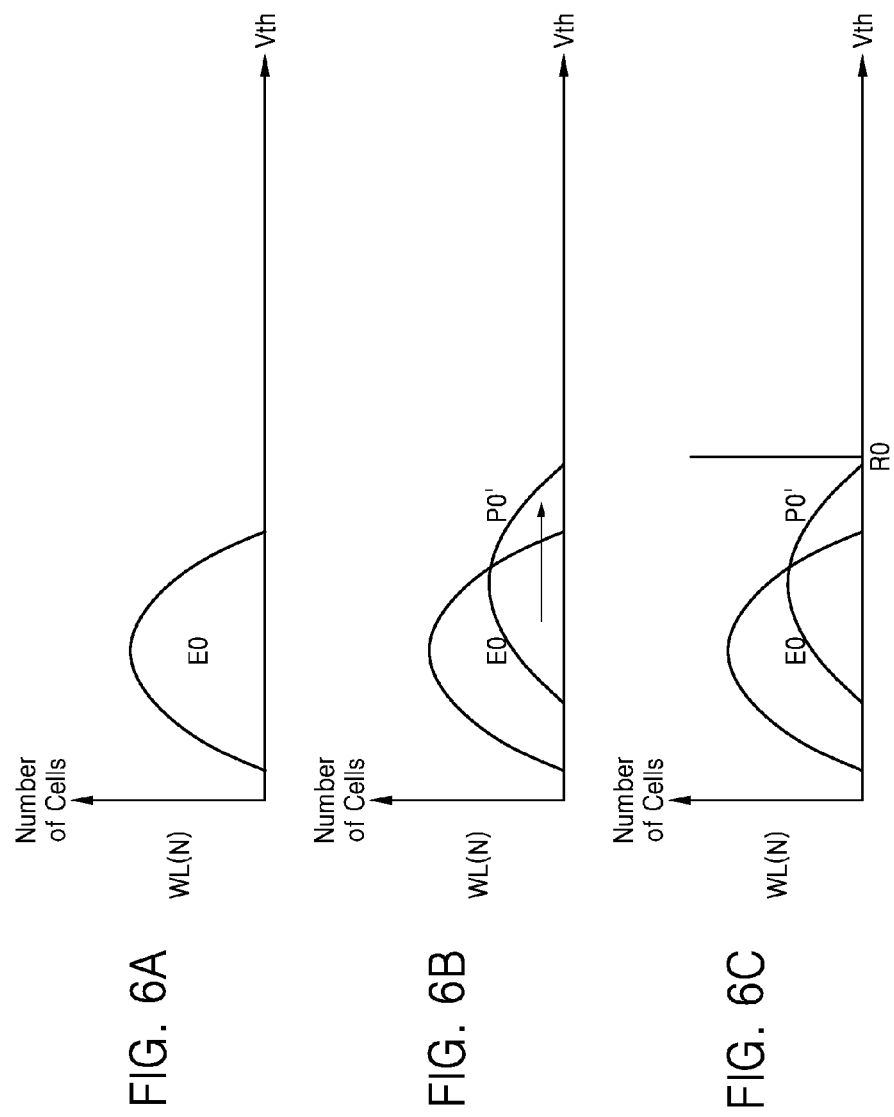
FIGS. 6A, 6B and 6C are related conceptual diagrams illustrating changes in the threshold voltage distribution of memory cells when a sudden power-off occurs during an LSB program operation.

FIG. 5 is a conceptual diagram illustrating a MLC program sequence, continuing with the assumptions noted above in relation to FIGS. 4A, 4B and 4C, for a case where a transient event (e.g., a sudden power-off or SPO) occurs during the LSB program operation. Hence, each it is further assumed that word lines WL12 through WL31 are being programmed using the MLC program operation described above which stores LSB and MSB data in two respective pages. The number shown for each of the LSB and MSB page sections for each word line indicates a programming place within the defined MLC program sequence. For instance, programming of the LSB page of the word line WL14 is in the 25th place in the MLC program sequence. Programming of the MBS page of the word line WL13 comes next, i.e., the 26th place in the MLC program sequence. After the MSB page of the word line WL13 is programmed, the 27th programming is performed on the LSB page of the word line WL15. Hence, as will be further assumed, the LSB program operation and the MSB page operation are alternately performed between an upper word line and a lower word line. Program offsets are predetermined and MLC program operations are performed according to the program offsets. When the MLC program operations are performed according to the program offsets, interference and coupling effect between adjacent word lines can be minimized Referring to FIG. 5, a SPO occurs while the LSB page of the word line WL16 is being programmed. When SPO occurs, power supply is abruptly cut off and the programming of constituent memory cells is interrupted, possibly, before being completed. As a result, the threshold voltage distribution of last-programmed memory cells connected to the last-programmed word line (e.g., WL16) experiencing the SPO may not be properly disposed in the erase state and/or any one of the program states. Instead, at least some of the last-programmed memory cells may be placed in a soft (errant) program state. This possible result is further explained in relation to FIGS. 6A, 6B and 6C.

FIGS. 6A, 6B and 6C are related conceptual diagrams illustrating actual changes in the threshold voltage distribution of certain last-programmed memory cells suffering the SPO during the LSB program operation. In particular, FIGS. 6A, 6B and 6C show changes in the threshold voltage distribution of the cells connected to the word line WL16 when the SPO occurs during programming of the LSB page of the word line WL16.

Referring to FIG. 6A, the threshold voltage distribution of the selected word line WL(N), e.g., the word line WL16 experiencing SPO in FIG. 5, is in the erase state E0 before a program operation is performed. When the LSB program operation on the selected word line WL(N) is interrupted due to the SPO, the threshold voltage distribution of the cells connected to the selected word line WL(N) is shown in FIG. 6B. The threshold voltage distribution of the cells connected to the selected word line WL(N) is in a soft program state P0' due to the interruption of programming As shown in FIG. 6C, the threshold voltage in the soft program state P0' may be lower than a defined read voltage R0. In some cases where a SPO occurs after programming has been performed to limited extent, the threshold voltage may actually be higher than the read voltage R0. After recovery from the transient event, when the LSB program operation is renewed for the last-programmed cells now in the soft program state P0' based on a determination that the LSP program operation has not been performed since the threshold voltage of the cells experienced SPO is higher than the erase state E0 and similar to the read voltage R0, an un-correctable read error may occur or an error may occur in program data.

Figure 7:
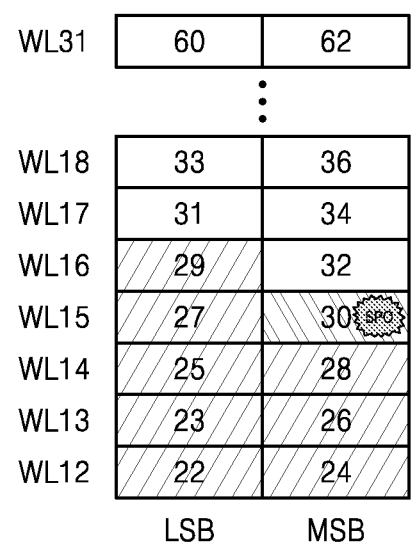
FIG. 7 is a conceptual diagram illustrating a MLC programming sequence in relation to a case where sudden power-off occurs during a most significant bit (MSB) program operation.

FIG. 7 is a conceptual diagram illustrating an MLC program sequence and a case where a SPO occurs during an MSB program operation. Referring to FIG. 7, each of the word lines WL12 through WL31 on which an MLC program operation is performed are again assumed to store data associated with two pages. The method of performing the MLC program operation was described with reference to FIG. 5.

Referring to FIG. 7, it is assumed that the SPO occurs during the MSB program operation on the word line WL15 after an LSB program operation was performed on the word line WL16. When SPO occurs, power is cut off and the MSB program operation is interrupted before being completed. As a result, the threshold voltage of cells connected to the word line WL15 may not be either the LSB program state or the MSB program state.

Figure 8:
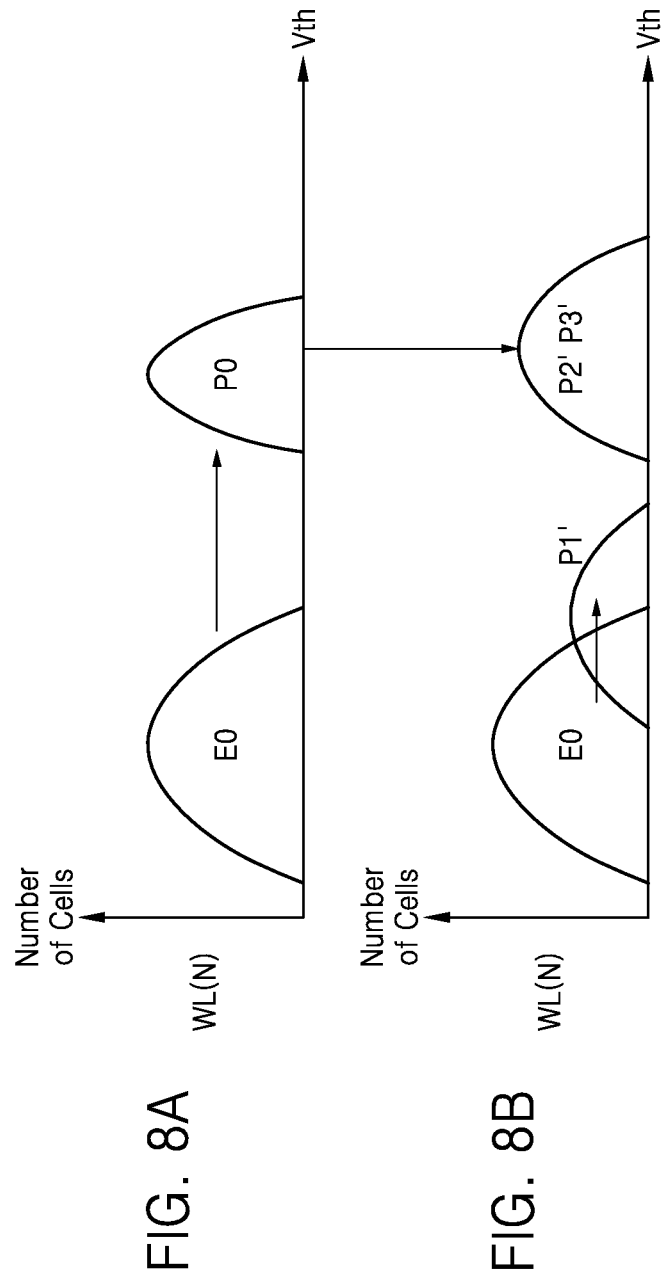
FIGS. 8A and 8B are related conceptual diagrams illustrating changes in the threshold voltage distribution of memory cells when sudden power-off occurs during an MSB program operation.

FIGS. 8A and 8B are related conceptual diagrams illustrating changes in the threshold voltage distribution of memory cells when a SPO occurs during an MSB program operation. Referring to FIG. 8A, the memory cells connected to the selected word line WL(N), e.g., the word line WL15 experiencing SPO in FIG. 7, have undergone the LSB program operation. The threshold voltage distribution of the selected memory cells is in the erase state E0 and the program state P0. FIG. 8B shows the threshold voltage distribution of the memory cells connected to the selected word line WL(N) when SPO occurs during the MSB program operation. When the MSB program operation is completed, the threshold voltage distribution has the four states E0, P1, P2, and P3, as shown in FIG. 4C. When SPO occurs, the threshold voltage in the erase state E0 does not shift to the state P1 but stops in a state P1'. The threshold voltage of the cells in the state P0 after the LSB program operation does not shift to the MSB program states P2 and P3 when SPO occurs during the MSB program operation. The threshold voltage of the selected cells is in a state P2' or P3' depending on a time when SPO occurs. The states P2' and P3' may be shown as a single threshold voltage distribution. After power supply is restored, when the MSB program operation is newly performed on the cells in the soft program state P1', P2', or P3' based on determination that the MSP program operation has not been performed, an un-correctable read error may occur or an error may occur in LSB program data of the selected word line WL(N). To avoid these problems, a soft programmed block is closed when SPO occurs so that a program operation does not proceed. Block closing is an operation that stops any additional program operation on a current block even though an upper word line of a word line experiencing SPO is in the erase state E0. When block closing is performed, an addition program operation is not performed on the soft programmed cells, so the reliability of stored data cannot be guaranteed. However, when SPOs occur frequently, the number of closed blocks increases and overall block utilization decreases. As a result, the lifespan of a memory device is reduced. Therefore, embodiments of the inventive concept provide a method of increasing the lifespan of a memory device by performing subsequent writing on the upper word line even when the current block includes memory cells that have been soft programmed due to a SPO. Subsequent writing is an operation of performing an additional program on the upper word line without block closing.

Figure 9:
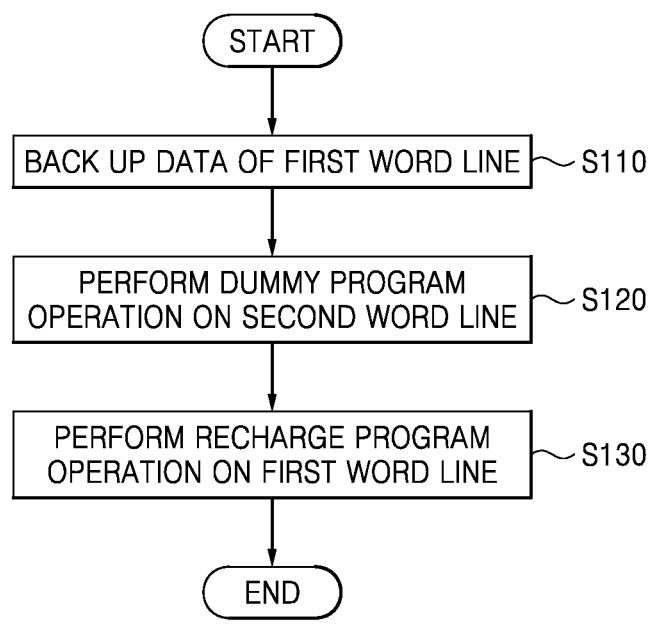
FIG. 9 is a flowchart summarizing a method of operating a memory device according to embodiments of the inventive concept.

FIG. 9 is a flowchart summarizing in one example a method of operating a memory device according to embodiments of the inventive concept. Referring to FIG. 9, the method generally includes backing up data stored in last-programmed memory cells connected to a first word line (S110), performing a dummy program operation on memory cells connected to a second word line adjacent to the first word line (S120), and performing a recharge program operation on the last-programmed memory cells connected to the first word line (S130). The method is provided to increase the lifespan of a memory device and guarantee reliability by performing subsequent writing on an upper word line in a block even when a program operation has been abnormally performed on memory cells.

In backing up the data (S110), first LSB data is read from the memory cells connected to the first word line and stored in a backup region. That is, when the power supplied to the memory device returns to normal after a program operation on the cells connected to the second word line is abnormally terminated due to a SPO, the LSB data of the cells connected to the first word line adjacent to the second word line will be stored in a backup block in order to guarantee the reliability of the memory device.

In performing the dummy program operation (S120), second LSB data may be programmed to the cells connected to the second word line. For instance, after the backup of the LSB data of the first word line is completed, the cells connected to the second word line, in which SPO has occurred, are dummy-programmed to store random data or predetermined data. During the dummy program operation, the data may be stored in the LSB page of the second word line.

In performing the recharge program operation (S130), the first LSB data is read from the cells connected to the first word line and then stored, first MSB data is stored, and a program operation is performed using the first LSB data and the first MSB data.

Figure 10:
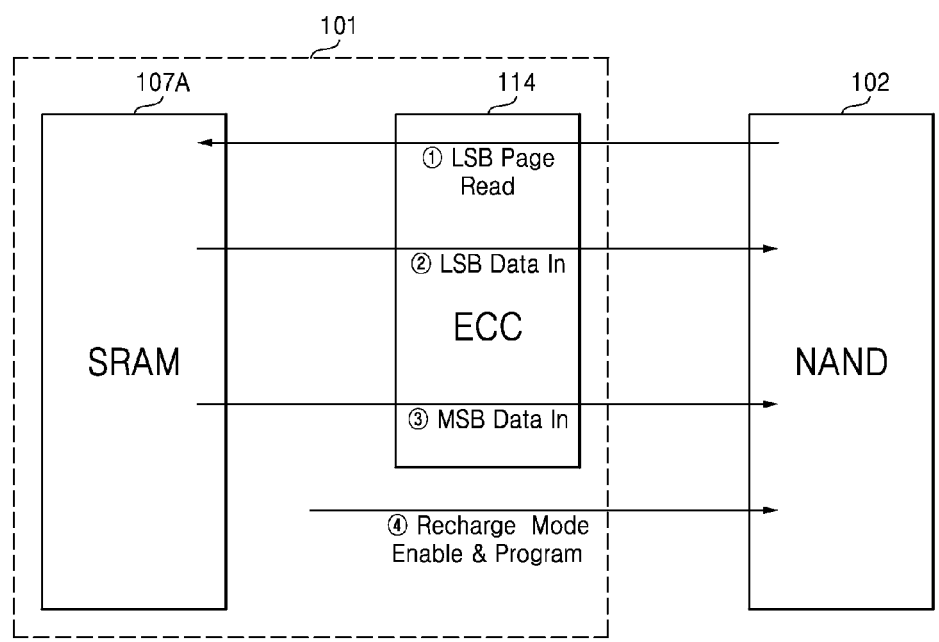
FIG. 10 is a conceptual diagram illustrating a recharge program operation for a memory device according to embodiments of the inventive concept.

FIG. 10 is a conceptual diagram further illustrating a recharge program operation that may be performed by a memory device according to embodiments of the inventive concept.

Referring to FIG. 10, after a dummy program operation is performed on a second word line, the memory controller 101 reads LSB page data from a first word line adjacent to the second word line and stores the LSB page data in a buffer 107A within the memory controller 101. Although an SRAM 107A functions as the buffer 107 illustrated in FIG. 1 in the embodiments illustrated in FIG. 10, the SRAM 107A may be replaced with a different type of memory. The memory controller 101 inputs LSB data stored in the buffer 107A and random or predetermined MSB data to be stored in the first word line to the nonvolatile memory device 102. The memory controller 101 may perform error correction using an error correction code (ECC) unit 114 during the data reading and input operation. When the transmission of the LSB data and MSB data for the first word line is completed, the memory controller 101 sends a command for execution of a recharge program operation to the nonvolatile memory device 102. The nonvolatile memory device 102 performs the recharge program operation in response to the command transmitted from the memory controller 101.

Figure 11:
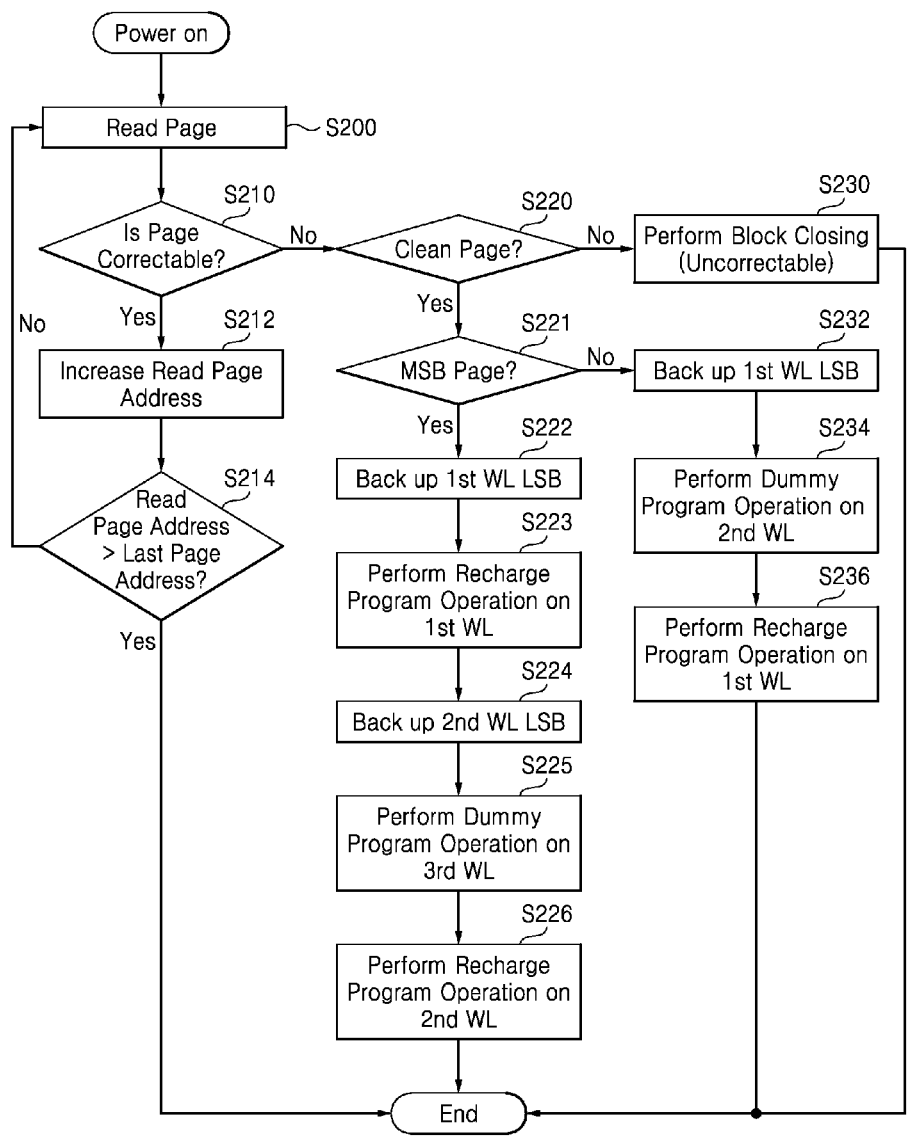
FIG. 11 is a flowchart summarizing a method of operating a memory device according to certain embodiments of the inventive concept.
Figure 12A:
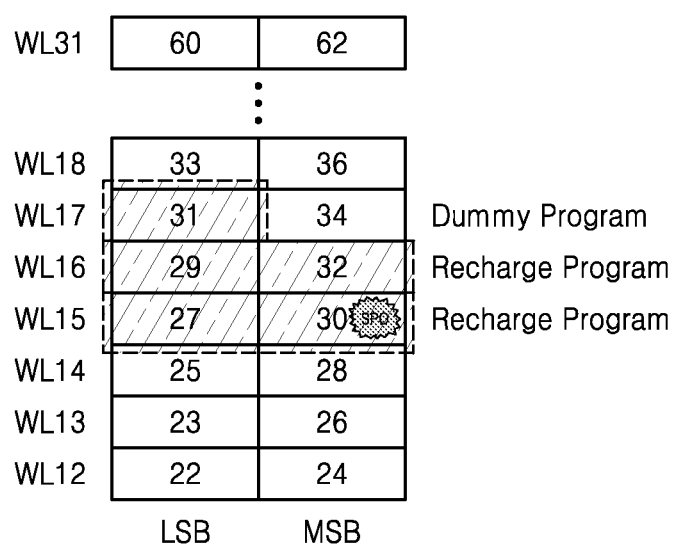
FIGS. 12A and 12B are respective conceptual diagrams further illustrating a method of operating a memory device according to certain embodiments of the inventive concept in cases where sudden power-off occurs during the MSB program operation and the LSB program operation.
Figure 12B:
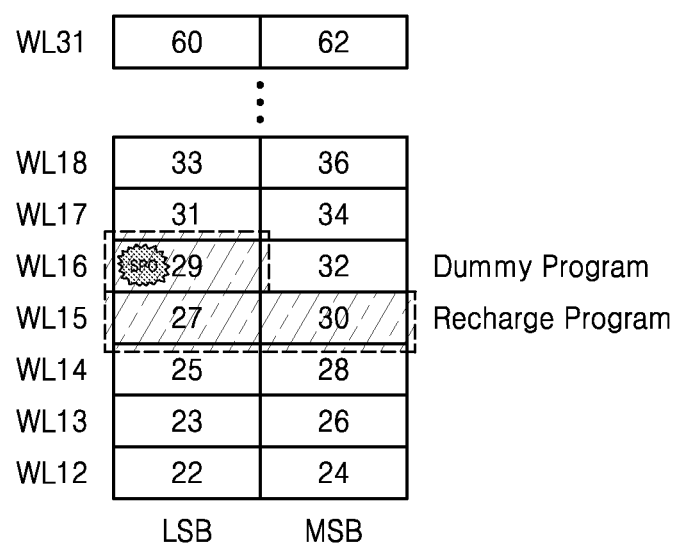

A method of operating a memory device according to other embodiments of the inventive concept will be described with reference to FIGS. 11, 12A and 12B. FIG. 11 is a flowchart summarizing in another example a method of operating a memory device according to certain embodiments of the inventive concept. FIGS. 12A and 12B are respective conceptual diagrams further illustrating execution of the method summarized by FIG. 11.

FIG. 11 shows an example of performing subsequent writing while guaranteeing reliability when power supply is restored following a program operation that abnormally terminates due to a SPO occurs during programming of an MSB or LSB page.

After recovery of power supply, the memory device performs a page read operation (S200). At this time, the page read operation is an operation of reading page data from a block programmed last while a page address is sequentially increased.

A controller determines whether the page that has been read is error-correctable page (S210). When it is determined that the read page is correctable, the method progresses to (S212), but when it is determined that the read page is not correctable or is a clean page, the method progresses to (S220). Even when there is an error in the page data, if the error is correctable, the read page is determined to be correctable.

Hence, if the page is determined to be correctable, a read page address is increased (S212). In order to read data from all pages of the last-programmed block, a page read operation can be performed with a sequential increase of the read page address. In the illustrated embodiment, the page address is assumed to be the same as a logical page address. In other embodiments, however, the page address may be the same as a physical page address. For instance, when the controller reads a first page and determines that the first page is correctable, the controller increases the read page address. Thereafter, the controller reads a second page corresponding to the read page address.

The controller determines whether the read page address is greater than the last page address (S214). When the read page address is less than the last page address, the controller again performs the page read operation (S200). When the read page address is greater than the last page address, the controller terminates the page read operation and the method ends.

When the page that has been read is determined to un-correctable, the controller determines whether the read page is a clean page (S220). When the read page is a clean page, the method progresses to (S221), but when the read page is not a clean page, the method progresses to (S230). The clean page means that the threshold voltage of all of the cells connected to the read page are in the erase state. When there is a clean page in the last-programmed block, the controller determines that the SPO occurred during a program operation directed to the clean page and performs certain operations guaranteeing the reliability in order to execute subsequent writing in the block. When the read page is neither correctable nor a clean page, the SPO occurred during a last program operation before being abnormal power-off. When the memory cells connected to the read page have been soft-programmed and thus the read page is not the clean page and cannot be recovered to original program data, that is, is not correctable, the block is determined to be un-correctable and the block is closed (S230).

The controller determines whether the clean page (S220=Yes) is an MSB page (S221). When the clean page is an MSB page, the method progresses to (S222), but when the clean page is an LSB page, the method progresses to (S232).

LSB data stored in memory cells connected to the first word line is backed up (S222). The first word line may be a word line in which SPO has occurred. This backup operation may include reading the LSB data from the memory cells connected to the first word line and storing the LSB data in a backup region. For instance, referring to FIG. 12A, when SPO has occurred in page 30, the controller performs the backup operation on page 27, that is, an LSB page stored in the word line WL15. At this time, the word line WL15 may be the first word line. The controller reads LSB page data from the word line WL15 and stores the LSB page data in a backup block. The LSB page data may be stored in the backup block configured from single level memory cells (SLC). The backup block may be positioned within a cell array of the memory device. The controller may perform a recharge program operation in order to compensate for distribution distortion occurred in the first word line. The controller performs backup just in case power supply is cut off temporarily during the recharge program operation. When power is cut off during the recharge program operation, it is highly likely that an error occurs in the LSB page data of the word line WL15. Therefore, the controller performs the backup operation on the first word line beforehand, so that it can restore the LSB page data of the first word line using the backup data even when power is cut off during the recharge program operation.

When the clean page is a MSB page (S221=Yes), the recharge program operation is performed on the memory cells connected to the first word line (S223). The recharge program operation may include reading first LSB data from the memory cells connected to the first word line, storing the first LSB data, storing first MSB data, and performing a program operation using the first LSB data and the first MSB data. For instance, referring to FIG. 12A, the controller reads the LSB data from the word line WL15 and stores the LSB data in a buffer. The LSB data of the word line WL15 may be the first LSB data. The controller transmits the LSB data from the buffer to the memory device. The controller transmits MSB data stored in the buffer to the memory device. The transmitted MSB data may be the first MSB data. The first MSB data may be a randomly generated value or a predetermined value. The first MSB data may be set so that the probability of error occurrence during reading of the first LSB data is low. The memory device may perform the recharge program operation based on the first MSB data and the first LSB data. The recharge program operation may enable both LSB data and MSB data to be stored simultaneously.

Then, the controller backs up LSB data stored in memory cells connected to a second word line adjacent to the first word line (S224). The backup operation is similar to that described in relation to (S222). The second word line may be an upper word line of the first word line. For instance, referring to FIG. 12A, when SPO occurs in the word line WL15, the word line WL16 may be the second word line. Distortion may occur in the distribution of the second word line due to the effect of SPO of a lower word line, i.e., the word line WL15. The backup operation may be performed for a recharge program operation which will be performed in order to compensate for the distortion.

Then, the controller performs a dummy program operation on memory cells connected to a third word line adjacent to the second word line (S225). In the dummy program operation, second LSB data may be programmed to the memory cells connected to the third word line. The second LSB data may be randomly generated or may be a predetermined value. The third word line may be an upper word line of the second word line. For instance, referring to FIG. 12A, when the word line WL16 is the second word line, the word line WL17 may be the third word line. The second LSB data stored in the third word line may be stored in an LSB page of the word line WL17. The controller may perform the dummy program operation on the third word line to perform a program operation according to a program sequence. The program sequence is ascending order of page addresses which is the same as a read sequence. The controller may perform a program operation on the MSB page of the word line WL16 after performing a program operation on the LSB page of the word line WL17 according to the program sequence. The word line WL17 is programmed not with data used by a user but with data randomly generated or predetermined by the controller.

Then, the controller performs a recharge program operation on the memory cells connected to the second word line (S226). The recharge program operation is performed in a similar manner to that described in relation to (S223). The distribution of the LSB page of the memory cells connected to the second word line may be distorted due to the effect of SPO occurred in the first word line. The controller may perform the recharge program operation on the second word line in order to offset the distortion. For the recharge program operation, the controller may generate MSB data so that an error occurrence probability is low when the LSB data is read from the memory cells connected to the second word line. For instance, referring to FIG. 12A, when SPO occurs in the word line WL15, the word line WL16 may be the second word line. The distribution of the second word line may be distorted due to the effect of SPO of the lower word line, i.e., the word line WL15. The recharge program operation may be performed to compensate for the distribution distortion in the second word line. After finishing the recharge program operation on the second word line, the controller may proceed to perform a program operation starting from the LSB page of the word line WL18 in response to a user's program command. The controller performs a recharge program operation and a dummy program operation on a word line in which SPO occurs and its adjacent word lines, thereby guaranteeing the reliability of stored data. The controller performs a program operation on an upper word line of the word line experienced SPO, thereby increasing block utilization and the lifespan of the memory device.

When the page that has been read is neither an error-correctable page nor a clean page, the controller determines that the page is un-correctable and performs block closing (S230). Block closing prevents a block including the un-correctable page from being additionally programmed.

When the clean page is an LSB page (S221=No), the controller backs up the LSB page data of the first word line (S232). For instance, referring to FIG. 12B, when SPO occurs in the word line WL16, the word line WL15 may be the first word line. When SPO occurs in the word line WL16, distortion may occur in a distribution representing the LSB page data stored in the memory cells connected to the word line WL15 which is an adjacent lower word line of the word line WL16. The controller may perform a recharge program operation in order to compensate for the distortion in the distribution of the first word line. Before performing the recharge program operation, the controller performs a backup operation just in case power supply is temporarily cut off during the recharge program operation. When power supply is cut off during the recharge program operation, it is highly likely that an error occurs in the LSB page data of the word line WL15. Therefore, the controller performs the backup operation on the first word line beforehand, so that it can restore the LSB page data of the first word line using the backup data even when power supply is cut off during the recharge program operation.

Then, the controller performs a dummy program operation on the memory cells connected to the second word line adjacent to the first word line (S234), where the dummy program operation is similar to that described in relation to (S225). For instance, referring to FIG. 12B, the word line WL16 may be the second word line. The second word line may be an adjacent upper line of the first word line.

Then, the controller performs a recharge program operation on the memory cells connected to the first word line (S236), where the recharge program operation is similar to that described in relation to (S223).

Figure 13:
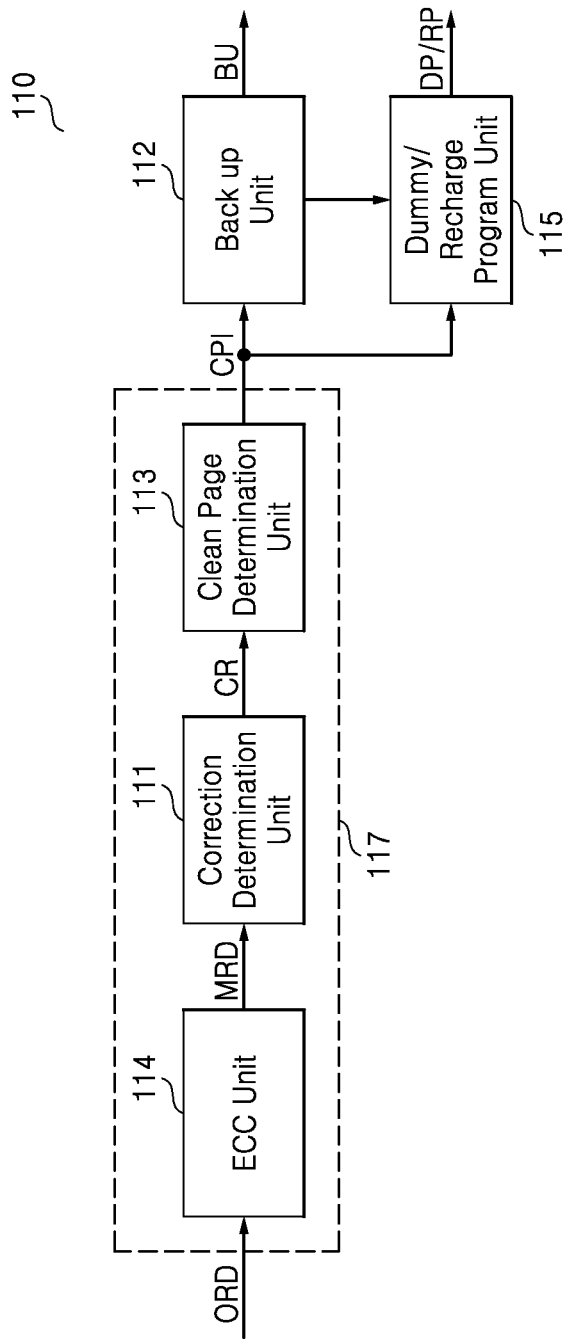
FIG. 13 is a block diagram further illustrating in another example the reliability guaranteeing unit 110 of FIG. 1B.

FIG. 13 is a block diagram further illustrating in another example the reliability guaranteeing unit 110 of FIG. 1B. Referring to FIG. 13, the reliability guaranteeing unit 110 again includes the target determination unit 117, backup unit 112, and dummy/recharge program unit 115 as previously described in relation to FIG. 1B. Here, however, the target determination unit 117 is shown as further including a correction determination unit 111, a clean page determination unit 113, and the ECC unit 114.

The ECC unit 114 may be used to perform error correction based on original read data ORD of a first word line and generate modified read data MRD. The modified read data MRD may then be transmitted to the correction determination unit 111.

The correction determination unit 111 may be used to generate a correction result signal CR from the modified read data MRD. That is, the correction determination unit 111 may be used to determine whether an error has been corrected based on the modified read data MRD and generate the correction result signal CR. The correction result signal CR may then be transmitted to the clean page determination unit 113.

The clean page determination unit 113 may be used to determine whether the modified read data MRD corresponds to a clean page based on the correction result signal CR and may generate clean page information CPI. That is, the clean page determination unit 113 determines that the modified read data MRD is a clean page when an error in the modified read data MRD is not correctable and the modified read data MRD is in an erase state and generates the clean page information CPI. The clean page information CPI may be transmitted to the backup unit 112 and the dummy/recharge program unit 115.

The backup unit 112 may generate a backup command BU based on the clean page information CPI. In response to the clean page information CPI, the backup unit 112 may backs up LSB page data of a second word line which is an adjacent lower word line of the first word line when the clean page is an LSB page. The backup unit 112 may perform a backup operation on both the first and second word lines when the clean page is an MSB page.

The dummy/recharge program unit 115 may perform a dummy program operation DP and a recharge program operation RP based on the clean page information CPI. In detail, when the clean page is determined to be an LSB page based on the clean page information CPI, the dummy/recharge program unit 115 performs the dummy program operation DP on the first word lines and performs the recharge program operation RP on the adjacent second word line. When the clean page is determined to be an MSB page, the dummy/recharge program unit 115 performs the recharge program operation RP on the first word line and the second word line adjacent to the first word line and performs the dummy program operation DP on a third word line adjacent to the second word line.

Figure 14:
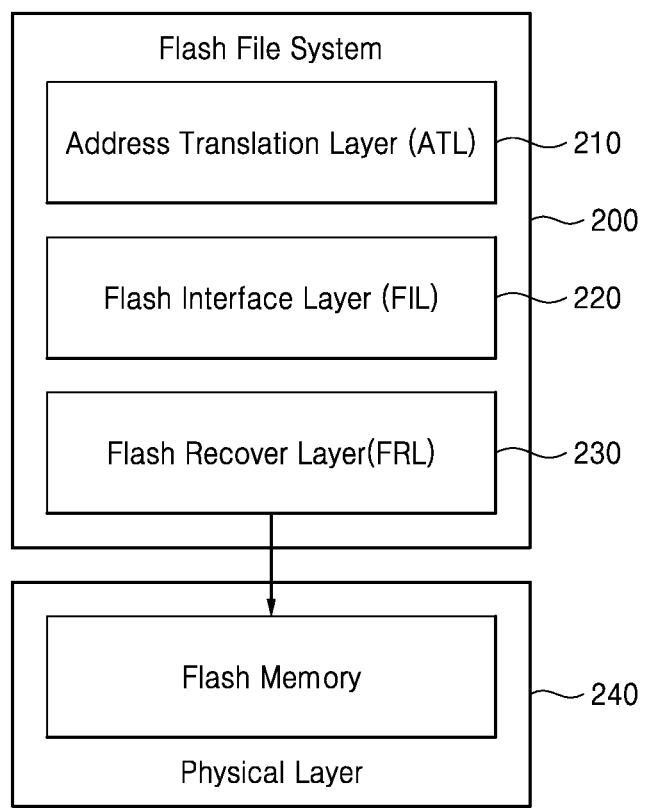
FIG. 14 is a conceptual diagram illustrating a file system that may be used in conjunction with a nonvolatile memory device in certain embodiments of the inventive concept.

FIG. 14 is a block diagram illustrating a flash file system 200 that may be used in conjunction with a nonvolatile memory device in certain embodiments of the inventive concept. The flash file system 200 includes an address translation layer 210, a flash interface layer 220, and a flash recover layer 230.

The address translation layer 210 may store block and page address information for subsequent writing. The address translation layer 210 may request the flash interface layer 220 to perform a backup operation, a dummy program operation, and a recharge program operation based on the address information.

The flash interface layer 220 controls interface between the two layers 210 and 230 so that the address translation layer 210 can access the flash recover layer 230. The flash recover layer 230 may send a control signal and a command to a flash memory 240 so that the flash memory performs the backup, dummy program and recharge program operations.

Figure 15:
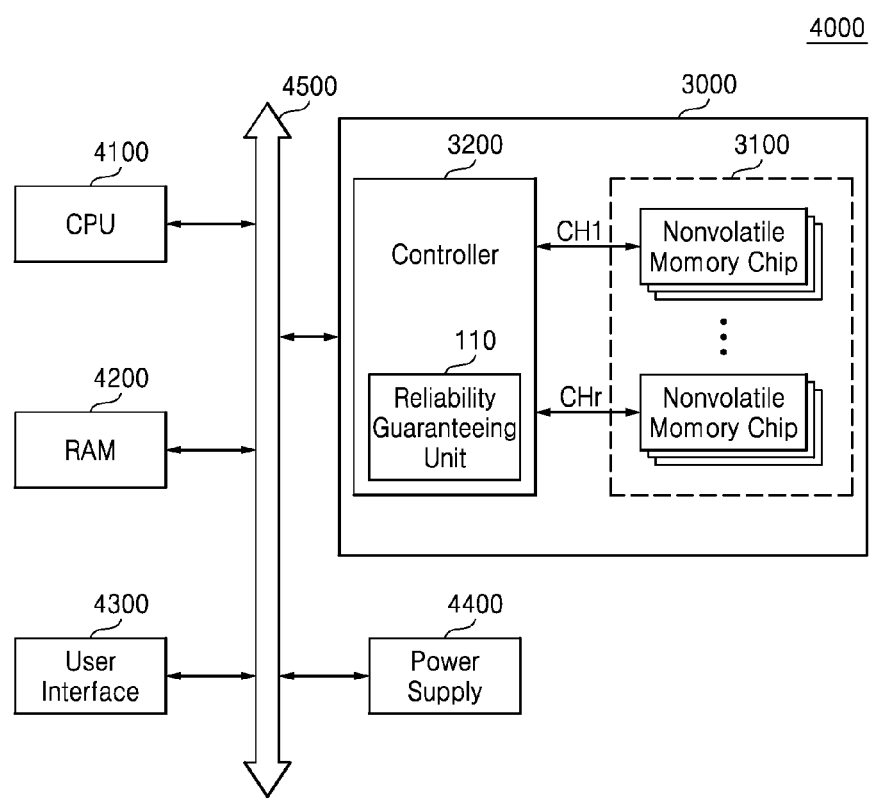
FIG. 15 is a block diagram of a memory system in the form of a solid state device (SSD) according to certain embodiments of the inventive concept.

FIG. 15 is a block diagram of a computational system 4000 including a memory system 3000 according to embodiments of the inventive concept. In particular, FIG. 15 shows an example in which a memory system consistent with the inventive concept is configured as a solid state device (SSD).

Referring to FIG. 15, the computing system 4000 includes a central processing unit (CPU) 4100, a RAM 4200, a user interface 4300, a power supply 4400, and the memory system 3000. The memory system 3000 may be an SSD.

The memory system, i.e., SSD 3000 is electrically connected with the CPU 4100, the RAM 4200, the user interface 4300, and the power supply 4400 through a system bus 4500. Data provided from the user interface 4300 and data processed by the CPU 4100 is stored in the memory system 3000. The memory system 3000 includes a controller 3200 and a nonvolatile memory device 3100. The controller 3200 may include the reliability guaranteeing unit 110 illustrated in FIGS. 1A and 1B.

The nonvolatile memory device 3100 is connected to the system bus 4500 via the controller 3200 in the embodiments illustrated in FIG. 15. However, the nonvolatile memory device 3100 may be directly connected to the system bus 4500 in other embodiments. At this time, the function of the controller 3200 is performed by the CPU 4100.

The memory system, i.e., SSD 3000 prevents memory capacity from decreasing and increases the reliability of stored data when a program operation on memory cells is abnormally terminated, as described above with reference to FIGS. 1A through 14. As a result, the reliability of the SSD 3000 is guaranteed and the lifespan of the SSD 3000 is increased.

Figure 16:
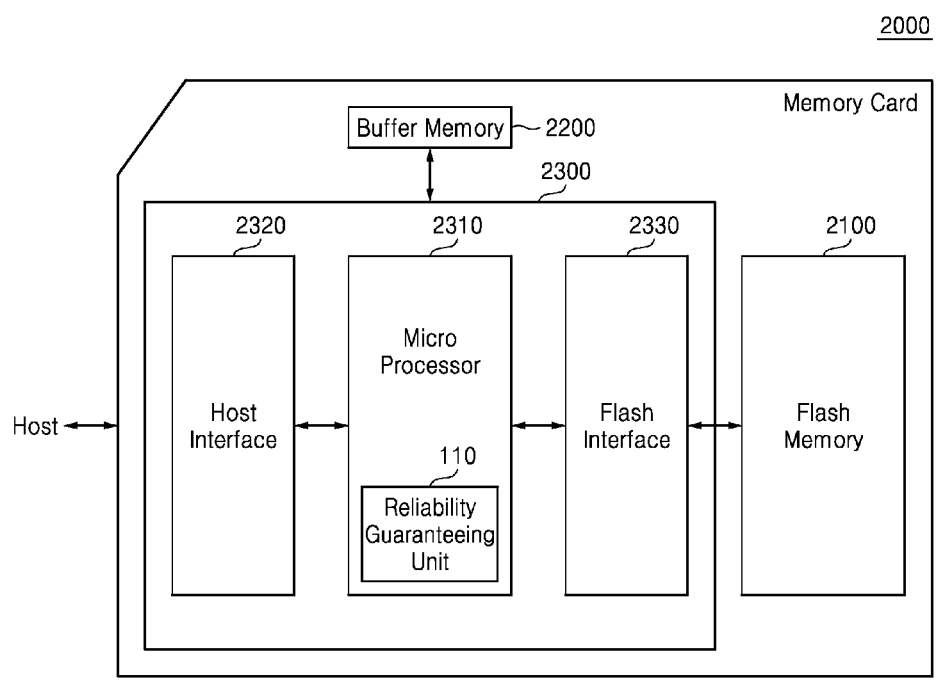
FIG. 16 is a block diagram of a memory system in the form of a memory card according to certain embodiments of the inventive concept.

FIG. 16 is a block diagram illustrating a memory system according to certain embodiments of the inventive concept configured as a memory card 2000. Referring to FIG. 16, the memory card 2000 includes a flash memory device 2100, a buffer memory device 2200, and a memory controller 2300 controlling the devices 2100 and 2200.

The structure and operations of the flash memory device 2100 may be the same as or similar to those of the nonvolatile memory device 102 illustrated in FIG. 1A. The buffer memory device 2200 temporarily stores data generated during the operation of the memory card 2000. The buffer memory device 2200 may be implemented using DRAM or SRAM.

The memory controller 2300 is connected between a host and the flash memory device 2100. In response to a request from the host, the memory controller 2300 accesses the flash memory device 2100. The memory controller 2300 includes a micro processor 2310, a host interface 2320, and a flash interface 2330.

The micro processor 2310 is configured to operate firmware. The host interface 2320 interfaces with the host using a card (e.g., multimedia card (MMC)) protocol for the data exchange between the host and the flash interface 2330.

The memory card 2000 may be used for an MMC, an embedded MMC (eMMC), a security digital (SD) card, a miniSD card, a memory stick, a SmartMedia card, a Trans-Flash card and so on.

The memory card 2000 prevents memory capacity from decreasing and increases the reliability of stored data when a program operation on memory cells is abnormally terminated, as described above with reference to FIGS. 1A through 14. As a result, the reliability of the memory card 2000 is guaranteed and the lifespan of the memory card 2000 is increased.

As described above, embodiments of the inventive concept preserve memory capacity by preventing a decrease in closed blocks, while also improving the reliability of stored data even in circumstances where a program operation is abnormally performed as the result of a transient event, such as a sudden power-off.

While the inventive concept has been particularly shown and described with reference to exemplary embodiments thereof, it will be understood by those of ordinary skill in the art that various changes in forms and details may be made therein without departing from the scope of the inventive concept as defined by the following claims.

What is claimed is:

1. A method of operating a memory device, the method comprising:
   reading a first page of memory cells connected to a selected word line, and determining whether the first page is a clean page;
   upon determining that the first page is the clean page, backing up data stored in the memory cells connected to a first word line;
   performing a dummy program operation on memory cells connected to a second word line adjacent to the first word line; and
   performing a recharge program operation on the memory cells connected to the first word line.

2. The method of claim 1, wherein, when the first page is a least significant bit (LSB) page, and the first word line is the selected word line.

3. The method of claim 2, wherein the backing up the data comprises:
   reading first LSB data from the memory cells connected to the first word line; and
   storing the first LSB data in a backup region.

4. The method of claim 3, wherein the backup region is configured from single level memory cells (SLC).

5. The method of claim 2, wherein the performing the dummy program operation comprises:
   programming second LSB data to the memory cells connected to the second word line.

6. The method of claim 5, wherein the second LSB data is randomly generated.

7. The method of claim 2, wherein the performing the recharge program operation comprises:
   reading first LSB data from the memory cells connected to the first word line, and storing the first LSB data;
   storing first most significant bit (MSB) data; and
   performing a program operation using the stored first LSB data and the stored first MSB data.

8. The method of claim 1, further comprising:
   upon determining that the first page is a most significant bit (MSB) page, backing up least significant bit (LSB) data stored in memory cells connected to a third word line adjacent to the first word line and performing a recharge program operation on the memory cells connected to the third word line, wherein the third word line is the selected word line.

9. A method of operating a memory device, the method comprising:
   reading a first page of memory cells connected to a first word line, and determining whether the first page is a clean page;
   upon determining that the first page is the clean page, backing up least significant bit (LSB) data stored in the memory cells connected to the first word line;
   performing a recharge program operation on the memory cells connected to the first word line;
   backing up LSB data stored in memory cells connected to a second word line adjacent to the first word line;

performing a dummy program operation on memory cells connected to a third word line adjacent to the second word line; and performing a recharge program operation on the memory cells connected to the second word line.

10. The method of claim 9, wherein the backing up the data comprises:

reading first LSB data from the memory cells connected to the word line, and storing the first LSB data in a backup region.

11. The method of claim 9, wherein the performing the dummy program operation comprises:

programming second LSB data to the memory cells connected to the third word line, wherein the second LSB data is randomly generated.

12. The method of claim 9, wherein the performing the recharge program operation comprises:

reading first LSB data from the memory cells connected to the word line, and storing the first LSB data;

storing first most significant bit (MSB) data; and performing a program operation using the stored first LSB data and the stored first MSB data.

13. A method of operating a memory device, the method comprising:

reading a plurality of pages from a last-programmed block following a transient event during a program operation directed to memory cells of the last-programmed block; and for each page of the plurality of pages, upon determining that the page is not correctable, upon further determining that the page is a clean page, and upon still further determining that the page is a most significant bit (MSB) page, backing up least significant bit (LSB) data stored by memory cells of a first word line and then performing a recharge program operation on the memory cells connected to the first word line;

backing up LSB data stored by memory cells of a second word line adjacent to the first word line;

performing a dummy program operation on memory cells connected to a third word line adjacent to the first word line; and performing a recharge program operation on the memory cells connected to the second word line.

14. The method of claim 13, further comprising:

for each page of the plurality of pages, upon determining that the page is not correctable, upon further determining that the page is a clean page, and upon still further determining that the page is not a most significant bit (MSB) page, backing up LSB data stored by memory cells of a first word line;

performing a dummy program operation on memory cells of a second word line adjacent to the first word line; and performing a recharge program operation on the memory cells of the first word line.

15. The method of claim 13, further comprising:

for each page of the plurality of pages, upon determining that the page is not correctable, and upon further determining that the page is not a clean page, closing a block including the page.

16. The method of claim 13, wherein backing up of the LSB data stored by memory cells of the first word line comprises writing the LSB data to a backup region, and the backing up of the LSB data stored by memory cells of the second word line comprises writing the LSB data to the backup region, wherein the backup region is configured from single level memory cells (SLC).

* * * * *